United States Patent
Wang et al.

(10) Patent No.: US 10,199,604 B2
(45) Date of Patent: Feb. 5, 2019

(54) ORGANIC LIGHT EMITTING DIODE SUBSTRATE

(71) Applicant: BOE TECHNOLOGY GROUP CO., LTD., Beijing (CN)

(72) Inventors: Tao Wang, Beijing (CN); Tao Sun, Beijing (CN); Song Zhang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/321,518

(22) PCT Filed: Mar. 29, 2016

(86) PCT No.: PCT/CN2016/077632
§ 371 (c)(1),
(2) Date: Dec. 22, 2016

(87) PCT Pub. No.: WO2016/161909
PCT Pub. Date: Oct. 13, 2016

(65) Prior Publication Data
US 2017/0214001 A1    Jul. 27, 2017

(30) Foreign Application Priority Data
Apr. 10, 2015  (CN) .......................... 2015 1 0169920

(51) Int. Cl.
*H01L 51/52*    (2006.01)

(52) U.S. Cl.
CPC ...... *H01L 51/5259* (2013.01); *H01L 51/5237* (2013.01); *H01L 51/5246* (2013.01); *H01L 51/5253* (2013.01)

(58) Field of Classification Search
CPC ..... H01L 23/28; H01L 27/32; H01L 51/5253; H01L 51/5259; H01L 51/5237; H01L 51/5246; H01L 51/52
See application file for complete search history.

(56) References Cited

U.S. PATENT DOCUMENTS

2004/0124442 A1* 7/2004 Koyama ........... G02F 1/136213
                                                              257/200
2006/0109413 A1* 5/2006 Lee .................... H01L 51/5246
                                                              349/153

(Continued)

FOREIGN PATENT DOCUMENTS

CN    101783362 A    7/2010
CN    101847650 A    9/2010

(Continued)

OTHER PUBLICATIONS

Notice of Reexamination in Chinese Application No. 201510169920.0 dated Jun. 22, 2017, with English translation.

(Continued)

*Primary Examiner* — Thanh T Nguyen
(74) *Attorney, Agent, or Firm* — Womble Bond Dickinson (US) LLP

(57) ABSTRACT

The present disclosure discloses an organic light emitting diode substrate, comprising: a base substrate and a device layer formed in a middle part thereon, a region on the base substrate other than the device layer being divided into an inner ring region that surrounds the device layer and an outer ring region outside the inner ring region; a first adhesive layer adhered on the device layer and the inner ring region and covering the device layer and the inner ring region, the first adhesive layer being used to block moisture and oxygen for the device layer; a second adhesive frame adhered on the outer ring region and the first adhesive layer and covering a (Continued)

portion of the first adhesive layer over the inner ring region, the second adhesive frame having a higher adhesive strength than the first adhesive layer.

20 Claims, 2 Drawing Sheets

(56) References Cited

U.S. PATENT DOCUMENTS

| | | | | |
|---|---|---|---|---|
| 2014/0252325 | A1* | 9/2014 | Kim | H01L 51/5259 257/40 |
| 2016/0322428 | A1* | 11/2016 | Kim | H01L 27/322 |

FOREIGN PATENT DOCUMENTS

| | | | |
|---|---|---|---|
| CN | 102983279 | A | 3/2013 |
| CN | 103885249 | A | 6/2014 |
| CN | 103956435 | A | 7/2014 |
| CN | 104124268 | A | 10/2014 |
| CN | 104465704 | A | 3/2015 |
| CN | 104766876 | A | 7/2015 |

OTHER PUBLICATIONS

International Search Report with English Language Translation, dated Jul. 1, 2016, PCT Application No. PCT/CN2016/077632.
Chinese Office Action with English Language Translation, dated Dec. 9, 2015, Chinese Application No. 201510169920.0.
Chinese Office Action with English Language Translation, dated Mar. 2, 2016, Chinese Application No. 201510169920.0.
Decision on Rejection with English Language Translation, dated Aug. 19, 2016, Chinese Application No. 201510169920.0.
Search Report in Chinese Application No. 201510169920.0 dated Aug. 28, 2015, with English translation.
Examination Decision Regarding Request for Reexamination (No. 138007) received for Chinese Patent Application No. 201510169920.0, dated Jan. 31, 2018, 20 pages (13 pages of English Translation and 7 pages of Office Action).

* cited by examiner

ORGANIC LIGHT EMITTING DIODE SUBSTRATE

RELATED APPLICATIONS

The present application is the U.S. national phase entry of PCT/CN2016/077632, with an international filing date of Mar. 29, 2016, which claims the benefit of Chinese Patent Application No. 201510169920.0, filed on Apr. 10, 2015, the entire disclosures of which are incorporated herein by reference.

FIELD

The present disclosure relates to the field of organic light emitting diode display, and particularly to an organic light emitting diode substrate.

BACKGROUND

Flexible display devices are widely applicable to the fields that require curved display because of its bendable property. An existing flexible display device employs an organic light emitting diode as a light source. However, the organic light emitting diode is very sensitive to moisture and oxygen in the air, so there is a high requirement on package of the organic light emitting diode substrate of the flexible display device, and the package effect directly impacts on the life of the organic light emitting diode substrate.

In the package of an existing organic light emitting diode substrate, the manner of entire-surface adhesion with an adhesive is mostly used. The organic light emitting diode substrate which is packaged in the manner of entire-surface adhesion with an adhesive comprises a base substrate, a device layer formed thereon comprising an organic light emitting diode, and an adhesive whose entire surface is adhered to the device layer and the base substrate. Commonly used adhesives include a pressure sensitive adhesive and a thermos-curing adhesive. If a pressure sensitive adhesive is used as the adhesive, though the adhesion with the pressure sensitive adhesive is quite secure, the pressure sensitive adhesive itself has poor capability of blocking moisture and oxygen, thus it cannot provide enough protection for the organic light emitting diode. If a thermo-curing adhesive is used as the adhesive, though the thermos-curing adhesive has good capability of blocking moisture and oxygen, its adhesive strength is poor and particularly it is prone to peel off at edges, thus it cannot provide enough protection for the organic light emitting diode, either. Accordingly, in an existing organic light emitting diode substrate which is packaged in the manner of entire-surface adhesion with an adhesive, there exists a technical problem that the organic light emitting diode cannot be effectively isolated from moisture and oxygen in the air.

SUMMARY

The present disclosure provides an organic light emitting diode substrate, which at least partly alleviates or eliminates the above shortcomings in the prior art.

In an aspect of the present disclosure, there is provided an organic light emitting diode substrate, comprising: a base substrate and a device layer formed in a middle part thereon, a region on the base substrate other than the device layer being divided into an inner ring region that surrounds the device layer and an outer ring region outside the inner ring region; a first adhesive layer adhered on the device layer and the inner ring region and covering the device layer and the inner ring region, the first adhesive layer being used to block moisture and oxygen for the device layer; a second adhesive frame adhered on the outer ring region and the first adhesive layer and covering a portion of the first adhesive layer over the inner ring region, the second adhesive frame having a higher adhesive strength than the first adhesive layer.

In an embodiment, overlapped portions of the first adhesive layer and the second adhesive frame over the inner ring region are pressed together.

In another embodiment, the second adhesive frame covers the outer ring region.

In a further embodiment, each corner of the second adhesive frame is provided with at least one protruding reinforcement for releasing a stress at the corner, the reinforcement being adhered to the base substrate.

In yet another embodiment, the reinforcement is in the shape of a round corner or a straight strip or a bent strip.

In another embodiment, the inner ring region is provided with at least one fixed protrusion which is pressed together with the first adhesive layer into an entirety.

In an embodiment, each corner of the inner ring region is provided with the fixed protrusion.

In another embodiment, the fixed protrusion is in the shape of a circular truncated cone or a straight wall or a bent wall or in the shape consistent with the shape of the corner of the inner ring region.

In a further embodiment, a frame formed by inner edges of the second adhesive frame overlaps the device layer.

In yet another embodiment, the device layer comprises an organic light emitting diode, the first adhesive layer is a first adhesive layer formed by a thermos-curing adhesive, and the second adhesive frame is a second adhesive frame formed by a pressure sensitive adhesive.

In the organic light emitting diode substrate provided by the present disclosure, the device layer is located in the middle part over the base substrate, the first adhesive layer is adhered on the device layer and the inner ring region that surrounds the device layer and covers the device layer and the inner ring region, and the second adhesive frame is adhered on the outer ring region and the portion of the first adhesive layer over the inner ring region and covers the portion of the first adhesive layer over the inner ring region. On the one hand, the inner ring region is covered by the first adhesive layer and the second adhesive frame, which avoids the situation that there is a seam between the first adhesive layer and the second adhesive frame, and consequently isolates the device layer from moisture and oxygen in the air effectively. On the other hand, the adhesive strength of the second adhesive frame is stronger such that the second adhesive frame is securely adhered to the base substrate. Meanwhile, the first adhesive layer is adhered on the base substrate such that the second adhesive frame and the first adhesive layer are adhered to the base substrate more securely, thereby isolating the device layer from moisture and oxygen in the air effectively.

DETAILED DESCRIPTION

The technical solutions in embodiments of the present disclosure will be clearly and completely described with reference to the drawings of embodiments of the present disclosure. Apparently, the described embodiments are only part of the embodiments of the present disclosure, rather than all of them. All other embodiments obtained by those ordinarily skilled in the art without spending inventive efforts on the basis of the embodiments in the present disclosure fall within the protection scope of the present disclosure.

Throughout the description, the following reference signs of main elements are used:

100 base substrate, 110 inner ring region, 111 fixed protrusion, 120 outer ring region, 200 device layer, 310 first adhesive layer, 320 second adhesive frame, 321 reinforcement.

Figure 1:
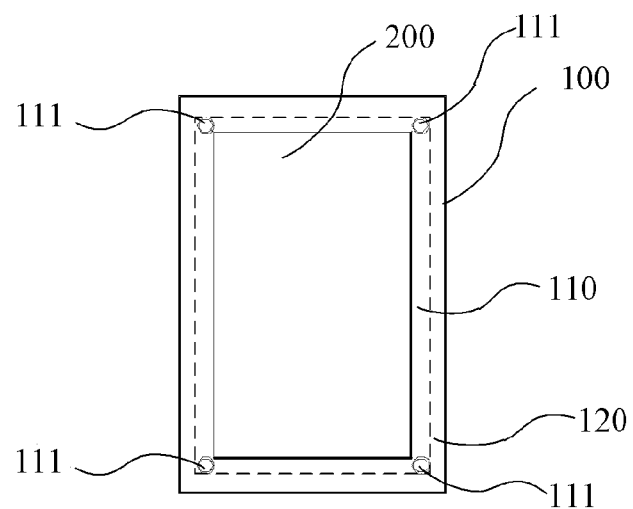
FIG. 1 is a schematic view illustrating a base substrate and a device layer of an organic light emitting diode substrate according to an embodiment of the present disclosure.
Figure 2:
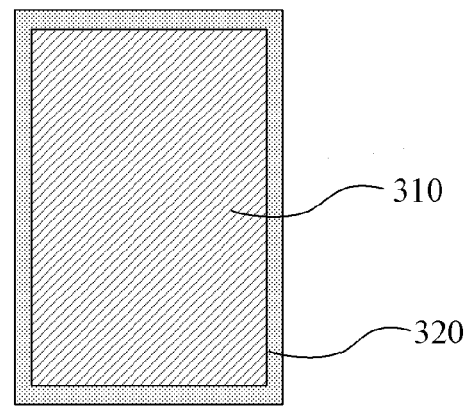
FIG. 2 is a schematic view illustrating a first adhesive layer and a second adhesive frame of the light emitting diode substrate shown in FIG. 1.
Figure 3:
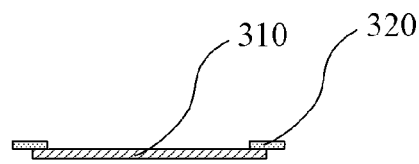
FIG. 3 is a schematic view illustrating the first adhesive layer and the second adhesive frame shown in FIG. 2 from another angle.

An organic light emitting diode substrate according to an embodiment of the present disclosure, as shown in FIG. 1, FIG. 2 and FIG. 3, comprises a base substrate 100 and a device layer 200 formed in the middle part thereof; the region on the base substrate other than the device layer being divided into an inner ring region 110 that surrounds the device layer and an outer ring region 120 outside the inner ring region; a first adhesive layer 310 that is adhered on the device layer and the inner ring region and covers the device layer 200 and the inner ring region 110, the first adhesive layer 310 being used to block moisture and oxygen for the device layer; a second adhesive frame 320 that is adhered on the outer ring region and the first adhesive layer and covers a portion of the first adhesive layer over the inner ring region, the second adhesive frame having a higher adhesive strength than the first adhesive layer.

The device layer comprises an organic light emitting diode, the first adhesive layer is a first adhesive layer formed by a thermos-curing adhesive, and the second adhesive frame is a second adhesive frame formed by a pressure sensitive adhesive.

In the organic light emitting diode substrate according to the present embodiment, the device layer is located in the middle part over the base substrate, the first adhesive layer formed by a thermo-curing adhesive is adhered on the device layer and the inner ring region that surrounds the device layer and covers the device layer and the inner ring region, and the second adhesive frame formed by a pressure sensitive adhesive is adhered on the outer ring region and the portion of the first adhesive layer over the inner ring region and covers the portion of the first adhesive layer over the inner ring region. On the one hand, the inner ring region is covered by the first adhesive layer and the second adhesive frame, which avoids the situation that there is a seam between the first adhesive layer and the second adhesive frame, and consequently isolates the device layer from moisture and oxygen in the air effectively. On the other hand, the adhesive strength of the second adhesive frame is stronger such that the second adhesive frame is securely adhered to the base substrate. Meanwhile, the first adhesive layer is adhered on the base substrate such that the second adhesive frame and the first adhesive layer are adhered to the base substrate more securely, thereby isolating the device layer from moisture and oxygen in the air effectively.

Figure 4:
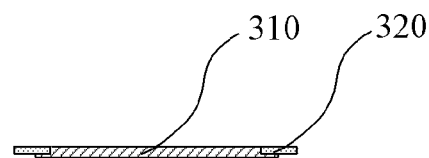
FIG. 4 is a schematic view illustrating the first adhesive layer and the second adhesive frame shown in FIG. 2 from another angle after they are pressed together.

In an illustrative embodiment, as shown in FIG. 4, overlapped portions of the first adhesive layer 310 and the second adhesive frame 320 over the inner ring region are pressed together. By pressing together the overlapped portions of the first adhesive layer 310 and the second adhesive frame 320 over the inner ring region, the fixation at the position where they overlap is tighter, thereby isolating the device layer from moisture and oxygen in the air effectively.

Optionally, as shown in FIG. 2, the second adhesive frame 320 further covers the outer ring region. In this way, the second adhesive frame covers the outer ring region and the portion of the first adhesive layer over the inner ring region. The adhesion between the second adhesive frame and the outer ring region enables the adhesion of the second adhesive frame to be more secure and prevents it from peeling off at edges.

Figure 5:
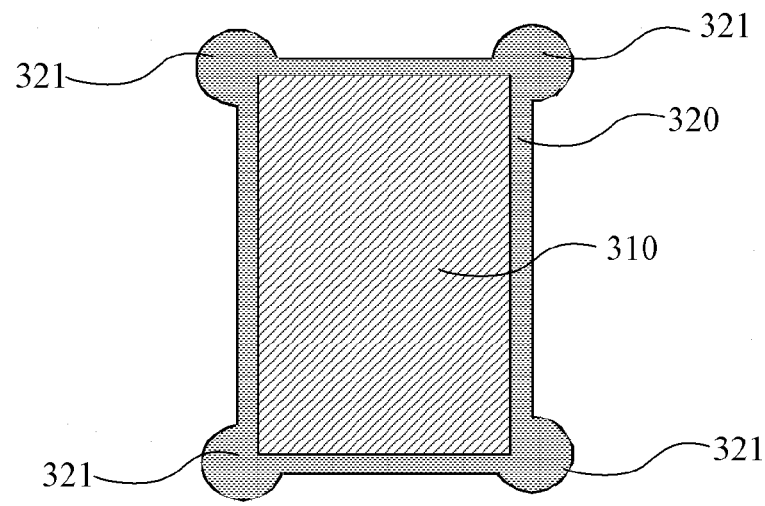
FIG. 5 is a schematic view illustrating a first adhesive layer and a second adhesive frame of a light emitting diode substrate according to another embodiment of the present disclosure.
Figure 6:
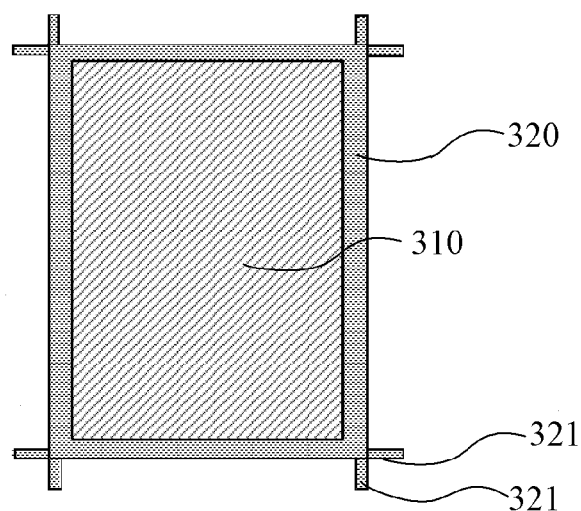
FIG. 6 is a schematic view illustrating a first adhesive layer and a second adhesive frame of a light emitting diode substrate according to a further embodiment of the present disclosure.

Optionally, as shown in FIGS. 5 and 6, each corner of the second adhesive frame is provided with at least one protruding reinforcement 321 for releasing the stress at the corner. The reinforcement is adhered to the base substrate. The stress at the corner of the second adhesive frame is concentrated. In order to release the stress at the corner, each corner is provided with a protruding reinforcement. The reinforcement increases the adhesion area with the base substrate, effectively releases the stress, and consequently decreases the risk of peeling off from the corners of the second adhesive frame.

Specifically, the reinforcement may be in the shape of a round corner as shown in FIG. 5, or in the shape of a straight strip as shown in FIG. 6 or a bent strip. It is to be noted that there are various specific forms for realization of the reinforcement. The shape of a round corner or a straight strip or a bent strip is only used for illustration. The reinforcement in any shape can increase the adhesion area with the base substrate and effectively release the stress.

Further, as shown in FIG. 1, the inner ring region 110 is further provided with at least one fixed protrusion 111 which is pressed together with the first adhesive layer into an entirety. In this manner, the fixed protrusion is pressed together with the first adhesive layer and the fixed protrusion enhances the adhesion between the first adhesive layer and the base substrate.

Optionally, as shown in FIG. 1, each corner of the inner ring region is provided with the fixed protrusion 111. The fixed protrusion at each corner of the inner ring region better adheres and fixes the first adhesive layer to the base substrate.

Further, the fixed protrusion is in the shape of a circular truncated cone or straight wall or bent wall or has a shape consistent with the shape of the corner of the inner ring region. It is to be noted that there are various specific forms for realization of the fixed protrusion. The shape of a circular truncated cone or straight wall or bent wall or the shape consistent with the shape of the corner of the inner ring region is only used for illustration. The fixed protrusion in any shape can better adhere and fix the first adhesive layer to the base substrate.

Optionally, the frame formed by inner edges of the second adhesive frame overlaps the device layer. In this way, the second adhesive frame would not cover the device layer or influence the device layer.

Apparently, those skilled in the art can make various modifications and variations to the present disclosure without departing from the spirit and scope thereof. In this way, if these modifications and variations to the present disclosure fall within the scope of the claims of the present disclosure and equivalent technologies thereof, the present disclosure also intends to encompass these modifications and variations.

The invention claimed is:

1. An organic light emitting diode substrate, comprising:
a base substrate and a device layer formed in a middle part thereon, a region on the base substrate other than the device layer being divided into an inner ring region that surrounds the device layer and an outer ring region outside the inner ring region;
a first adhesive layer adhered on the device layer and the inner ring region and covering the device layer and the inner ring region, the first adhesive layer configured to block moisture and oxygen for the device layer;
a second adhesive frame adhered on the outer ring region and the first adhesive layer and configured to cover a portion of the first adhesive layer over the inner ring region, the second adhesive frame having a higher adhesive strength than the first adhesive layer and extending beyond the first adhesive layer.

2. The organic light emitting diode substrate according to claim 1, wherein overlapped portions of the first adhesive layer and the second adhesive frame over the inner ring region are pressed together.

3. The organic light emitting diode substrate according to claim 2, wherein the second adhesive frame covers the outer ring region.

4. The organic light emitting diode substrate according to claim 2, wherein each corner of the second adhesive frame is provided with at least one protruding reinforcement for releasing a stress at the corner, the reinforcement being adhered to the base substrate.

5. The organic light emitting diode substrate according to claim 2, wherein the inner ring region is provided with at least one fixed protrusion which is pressed together with the first adhesive layer into an entirety.

6. The organic light emitting diode substrate according to claim 2, wherein a frame formed by inner edges of the second adhesive frame overlaps the device layer.

7. The organic light emitting diode substrate according to claim 1, wherein the second adhesive frame covers the outer ring region.

8. The organic light emitting diode substrate according to claim 7, wherein each corner of the second adhesive frame is provided with at least one protruding reinforcement for releasing a stress at the corner, the reinforcement being adhered to the base substrate.

9. The organic light emitting diode substrate according to claim 7, wherein the inner ring region is provided with at least one fixed protrusion which is pressed together with the first adhesive layer into an entirety.

10. The organic light emitting diode substrate according to claim 7, wherein a frame formed by inner edges of the second adhesive frame overlaps the device layer.

11. The organic light emitting diode substrate according to claim 1, wherein each corner of the second adhesive frame is provided with at least one protruding reinforcement for releasing a stress at the corner, the reinforcement being adhered to the base substrate.

12. The organic light emitting diode substrate according to claim 11, wherein the reinforcement is in the shape of a round corner or a straight strip or a bent strip.

13. The organic light emitting diode substrate according to claim 11, wherein the inner ring region is provided with at least one fixed protrusion which is pressed together with the first adhesive layer into an entirety.

14. The organic light emitting diode substrate according to claim 12, wherein the inner ring region is provided with at least one fixed protrusion which is pressed together with the first adhesive layer into an entirety.

15. The organic light emitting diode substrate according to claim 11, wherein a frame formed by inner edges of the second adhesive frame overlaps the device layer.

16. The organic light emitting diode substrate according to claim 1, wherein the inner ring region is provided with at least one fixed protrusion which is pressed together with the first adhesive layer into an entirety.

17. The organic light emitting diode substrate according to claim 16, wherein each corner of the inner ring region is provided with the fixed protrusion.

18. The organic light emitting diode substrate according to claim 17, wherein the fixed protrusion is in a shape of a circular truncated cone or a straight wall or a bent wall or in a shape consistent with a shape of the corner of the inner ring region.

19. The organic light emitting diode substrate according to claim 1, wherein a frame formed by inner edges of the second adhesive frame overlaps the device layer.

20. The organic light emitting diode substrate according to claim 1, wherein the device layer comprises an organic light emitting diode, the first adhesive layer is a first adhesive layer formed by a thermos-curing adhesive, and the second adhesive frame is a second adhesive frame formed by a pressure sensitive adhesive.

* * * * *